United States Patent
Hidaka et al.

(10) Patent No.: US 7,217,899 B2
(45) Date of Patent: May 15, 2007

(54) VEHICLE DOOR OUTER HANDLE SYSTEM

(75) Inventors: Osamu Hidaka, Miyazaki (JP); Yuho Otsuta, Miyazaki (JP); Masahiko Sueyoshi, Miyazaki (JP); Hideaki Arai, Saitama (JP); Akira Kamikura, Saitama (JP)

(73) Assignees: Kabushiki Kaisha Honda Lock, Miyazaki (JP); Honda Motor Co., Ltd., Tokyo (JP)

( * ) Notice: Subject to any disclaimer, the term of this patent is extended or adjusted under 35 U.S.C. 154(b) by 64 days.

(21) Appl. No.: 11/075,043

(22) Filed: Mar. 8, 2005

(65) Prior Publication Data

US 2005/0236846 A1 Oct. 27, 2005

(30) Foreign Application Priority Data

Mar. 12, 2004 (JP) .............................. 2004-070549

(51) Int. Cl.
*H01H 9/00* (2006.01)
(52) U.S. Cl. ..................................... 200/600; 200/61.85
(58) Field of Classification Search ................ 200/600, 200/5 R, 61.85, 61.93, 61.58 R, 293.1; 70/237, 70/255, 258; 340/522, 573.1
See application file for complete search history.

(56) References Cited

U.S. PATENT DOCUMENTS

| | | | | |
|---|---|---|---|---|
| 6,075,294 | A * | 6/2000 | Van den Boom et al. | . 307/10.1 |
| 6,527,316 | B1 * | 3/2003 | Agostini et al. | ............. 292/347 |
| 6,740,834 | B2 * | 5/2004 | Sueyoshi et al. | ............ 200/600 |
| 6,883,840 | B2 * | 4/2005 | Sueyoshi et al. | ......... 292/336.3 |
| 2003/0122556 | A1 * | 7/2003 | Sueyoshi et al. | ............ 324/686 |

FOREIGN PATENT DOCUMENTS

JP       2003-221949       8/2003

* cited by examiner

*Primary Examiner*—Tu Ba Hoang
*Assistant Examiner*—M. Fishman
(74) *Attorney, Agent, or Firm*—Carrier, Blackman & Associates, P.C.; Joseph P. Carrier; William D. Blackman

(57) ABSTRACT

A vehicle door outer handle system includes: an operating handle formed from a handle main body and a cover covering the outer side of the handle main body; a pair of electrodes; and a circuit board on which a detection circuit is provided for detecting a change in capacitance between the electrodes; the electrodes and the circuit board being housed within the operating handle. The electrodes are patterned on the circuit board, and a ground pattern connected to the detection circuit is formed so as to be disposed at a position offset from the electrodes if viewed through the circuit board.

6 Claims, 12 Drawing Sheets

VEHICLE DOOR OUTER HANDLE SYSTEM

Japanese priority application No. 2004-70549 upon which the present application is based is hereby incorporated in its entirety herein by reference.

BACKGROUND OF THE INVENTION

1. Field of the Invention

The present invention relates to a vehicle door outer handle system that enables a vehicle user's intention to unlock to be confirmed by means of a change in capacitance when the vehicle user's hand approaches or touches an operating handle, and in particular to a vehicle door outer handle system that includes an operating handle formed from a handle main body made of a synthetic resin and a cover made of a synthetic resin so as to cover the outer side of the handle main body, the operating handle being disposed on an outer side of a vehicle door and housing therewithin a pair of electrodes and a circuit board on which a detection circuit is provided for detecting a change in capacitance between the electrodes.

2. Description of the Related Art

Japanese Patent Application Laid-open No. 2003-221949 discloses a conventional arrangement for confirming a vehicle user's intention to unlock a door, in which a capacitance sensor is disposed within an operating handle, and a vehicle user's intention to unlock a door is confirmed by means of a change in capacitance when the vehicle user's hand approaches or touches the operating handle.

However, in this conventional arrangement, since electrodes formed as members that are separate from a circuit board are connected to a detection circuit provided on the circuit board, it is necessary to secure a space for arranging the electrodes within the operating handle in addition to a space for housing the circuit board, that is, the space that has to be reserved within the operating handle is relatively large, leading to a difficulty in thinning an operating handle.

SUMMARY OF THE INVENTION

The present invention has been accomplished under the above-mentioned circumstances, and it is an object thereof to provide a vehicle door outer handle system that enables an operating handle to be made thin and the noise immunity to be improved.

In order to attain this object, in accordance with a first aspect of the present invention, there is provided a vehicle door outer handle system that includes an operating handle formed from a handle main body made of a synthetic resin and a cover made of a synthetic resin so as to cover the outer side of the handle main body, the operating handle being disposed on an outer side of a vehicle door and housing therewithin a pair of electrodes and a circuit board on which a detection circuit is provided for detecting a change in capacitance between the electrodes, wherein the electrodes are patterned on the circuit board, and a ground pattern connected to the detection circuit is formed so as to be disposed at a position offset from the electrodes if viewed through the circuit board.

Furthermore, in accordance with a second aspect of the present invention, in addition to the first aspect, there is provided the vehicle door outer handle system wherein the electrodes are patterned on the circuit board in parallel to each other, and the ground pattern is disposed at a position corresponding to a position between the electrodes.

With the first aspect of the present invention, since the electrodes are patterned on the circuit board, it is unnecessary to secure a space for arranging the electrodes separately from the circuit board, thereby enabling the operating handle to be made thin. However, when the electrodes are patterned, the capacitance between the electrode and the ground pattern increases, and this increase in capacitance is added to an original base capacitance (C component) of the circuit board when the electrodes detect a change in the capacitance. As a result, the percentage change in capacitance upon the approach or touch of a vehicle user's hand is reduced. If the sensitivity is increased as a countermeasure, noise is easily detected, but disposing the ground pattern of the circuit board at a position offset from the pair of electrodes if viewed through the circuit board can suppress the increase in capacitance, thereby suppressing the reduction in the percentage change in capacitance upon the approach or touch of a vehicle user's hand, and thus enhancing the noise immunity.

In accordance with the second aspect of the present invention, it is possible to efficiently arrange the ground pattern and the electrode pattern within the circuit board while suppressing any increase in the capacitance.

The above-mentioned object, other objects, characteristics, and advantages of the present invention will become apparent from an explanation of a preferred embodiment that will be described in detail below by reference to the attached drawings.

DESCRIPTION OF THE PREFERRED EMBODIMENT

Figure 1:
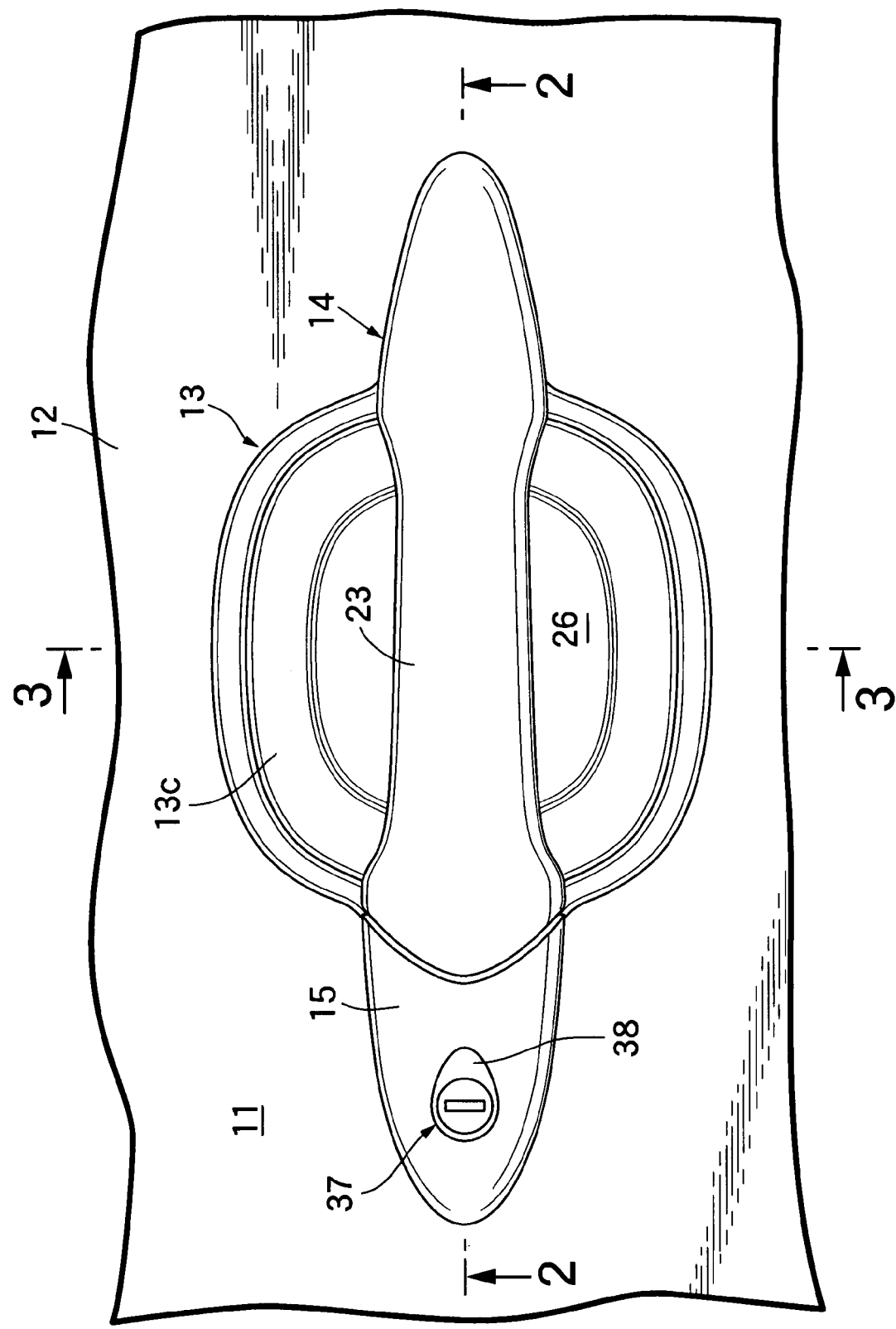
FIG. 1 is a side view of a part of a vehicle door.
Figure 2:
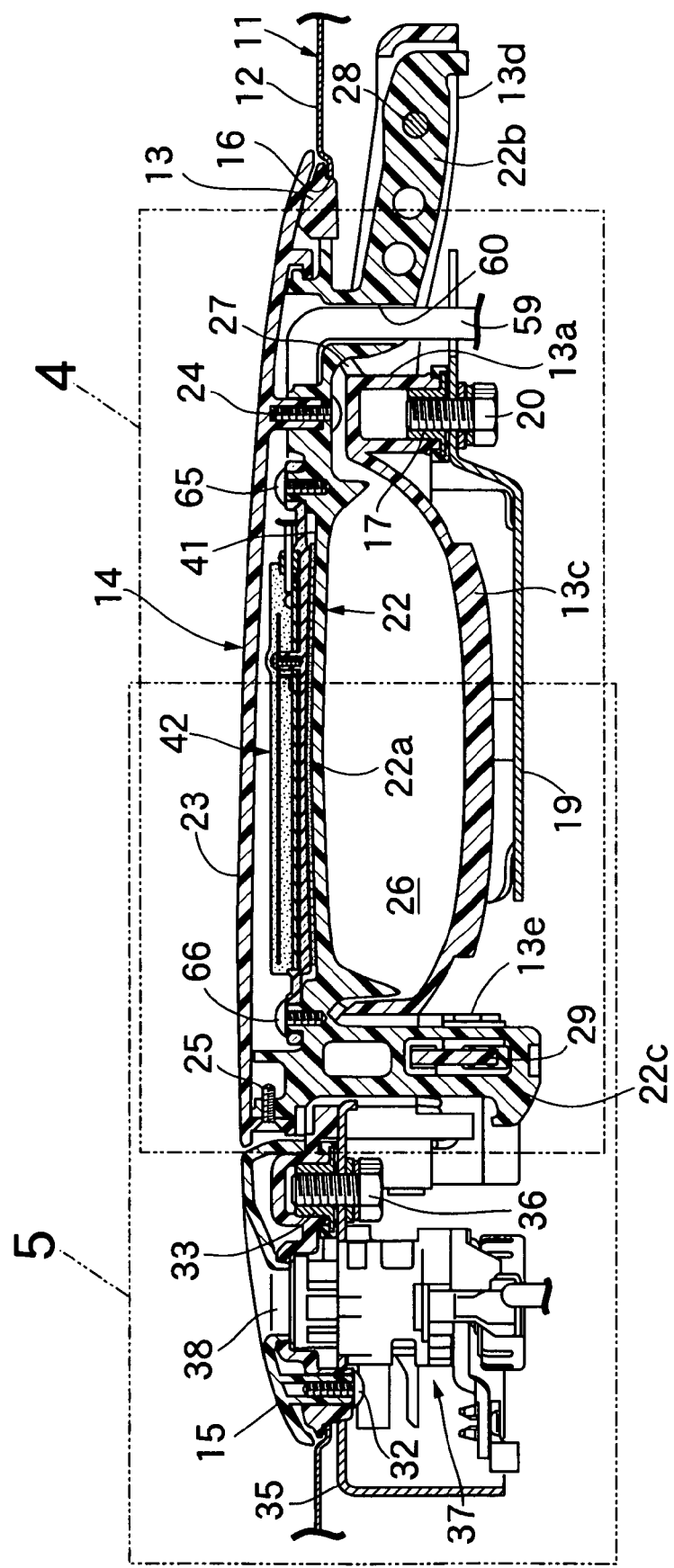
FIG. 2 is a sectional view along line 2-2 in FIG. 1.
Figure 3:
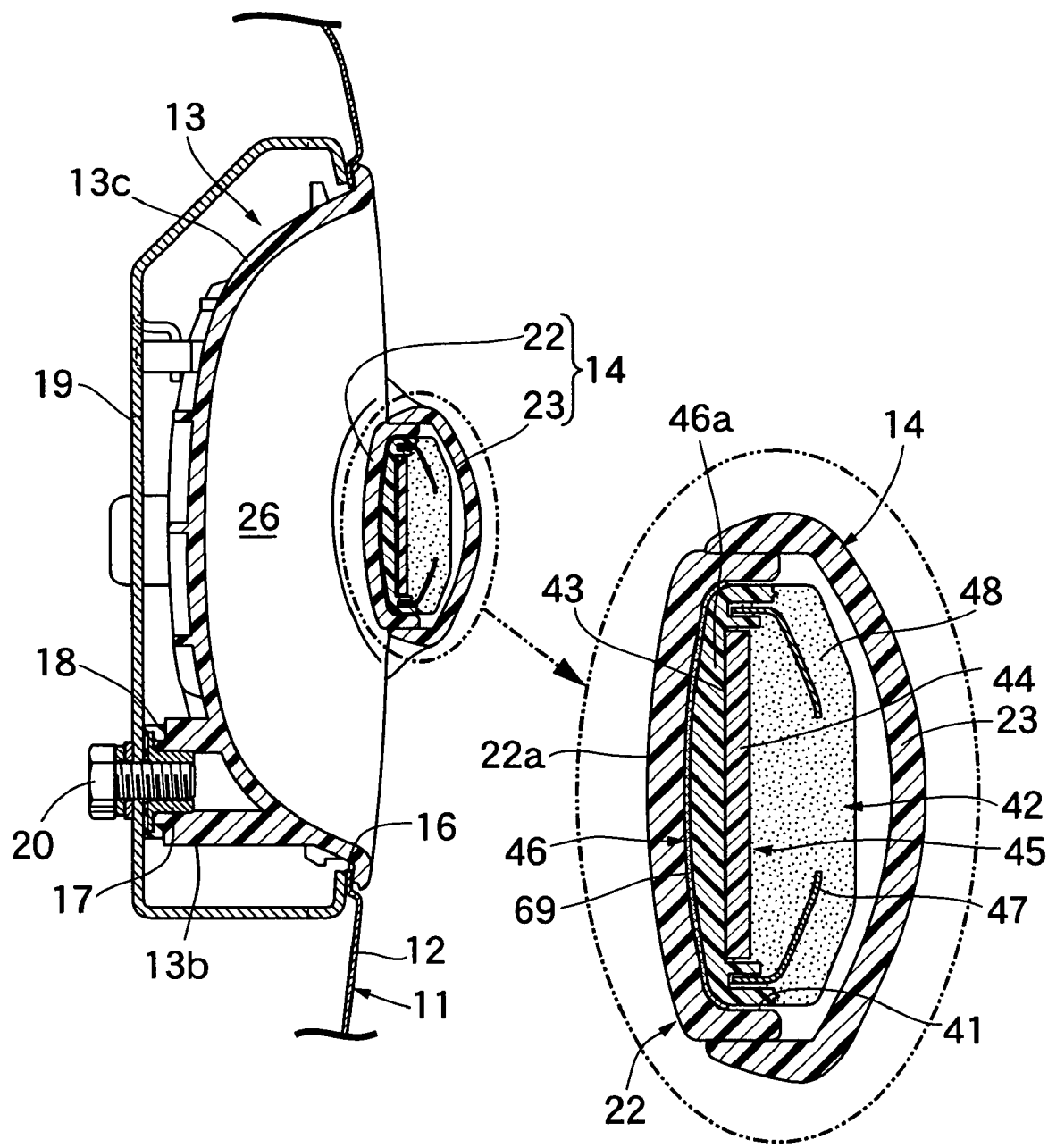
FIG. 3 is a sectional view along line 3-3 in FIG. 1.

Referring first to FIG. 1 to FIG. 3, an outer panel 12 of a vehicle door 11, which is, for example, a side door of a passenger vehicle, is equipped with an outer handle system. This outer handle system includes a handle case 13 mounted on the outer panel 12, an operating handle 14 extending in the fore-and-aft direction of the vehicle (the left and right direction in FIG. 1 and FIG. 2) and having one end thereof, in the longitudinal direction, pivotably supported by the handle case 13, and a base member 15 mounted on the handle case 13 at the other end of the operating handle 14.

Figure 4:
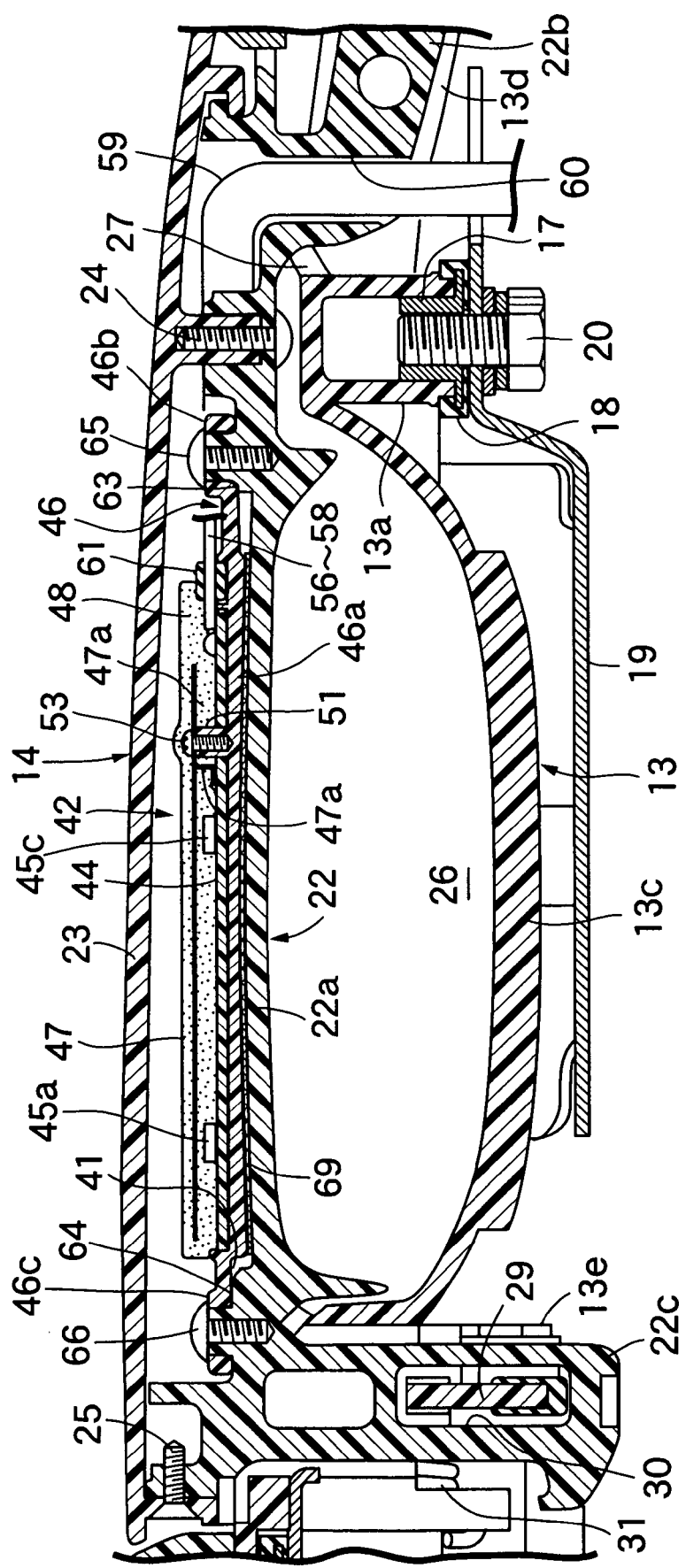
FIG. 4 is an enlarged view of part 4 of FIG. 2.
Figure 5:
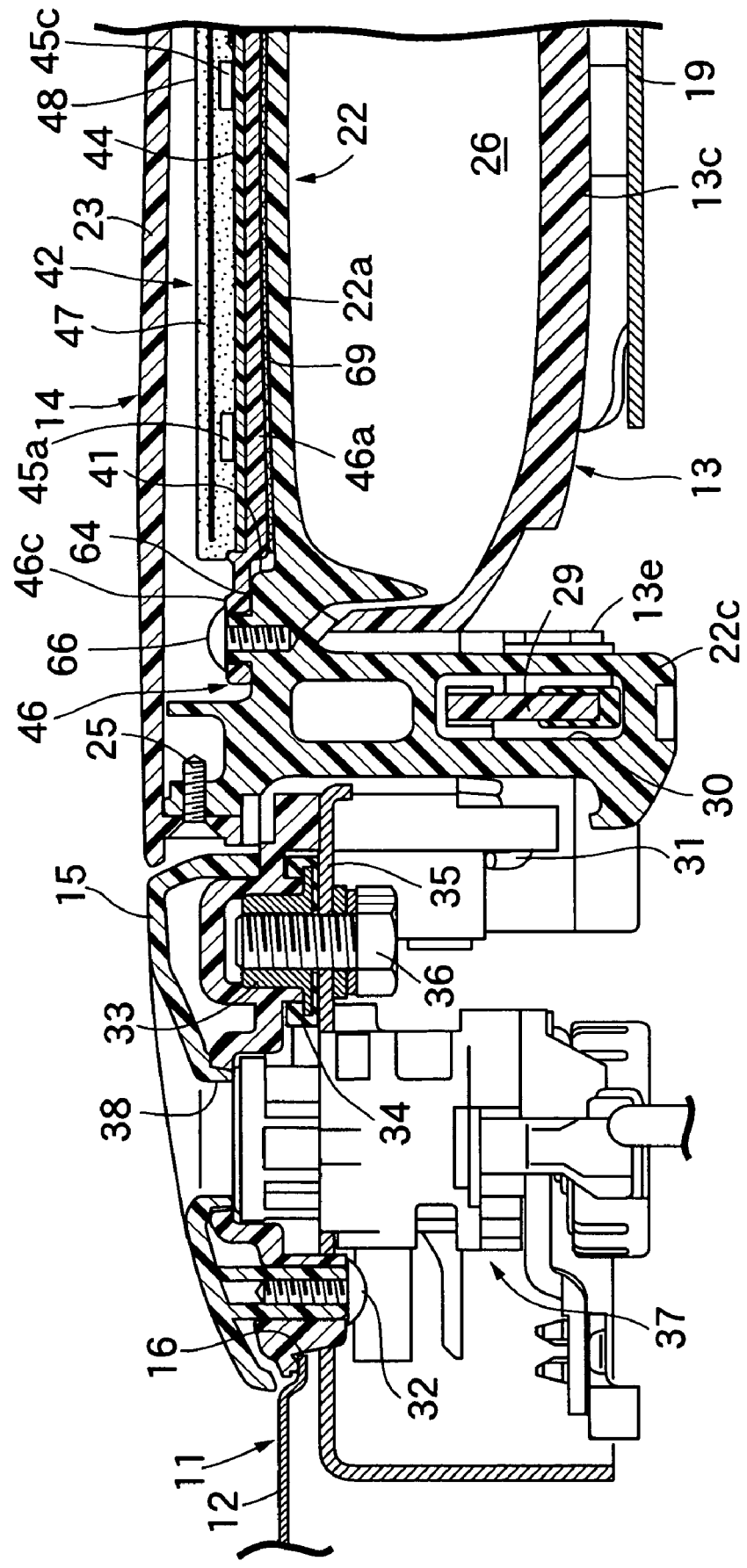
FIG. 5 is an enlarged view of part 5 of FIG. 2.

Referring to FIG. 4 and FIG. 5 together, the outer panel 12 is provided with an aperture 16. A peripheral edge of the handle case 13, which is made of a synthetic resin so as to block the aperture 16, abuts against an outer face of the outer panel 12 along the entire peripheral edge of the aperture 16. Moreover, integrally provided at a plurality of, for example, two positions on the reverse side of the handle case 13 are cylindrical boss portions 13a and 13b, to which nuts 17 are mold-bonded. A metal protective cover 19 abutting against the nuts 17 via cap-shaped seat members 18 attached to the nuts 17 is mounted on the reverse side of the handle case 13 by screwing and tightening, into the nuts 17, bolts 20 inserted through the protective cover 19. Moreover, the protective cover 19 abuts against a reverse face of the outer panel 12 in parts of the peripheral edge of the aperture 16, and the handle case 13 is mounted on the outer panel 12 so as to sandwich the outer panel 12 between the handle case 13 and the protective cover 19.

The operating handle 14 is formed by tightening together, by means of a plurality of, for example, a pair of screw members 24 and 25, a handle main body 22 that is made of a rigid synthetic resin and extends in the fore-and-aft direction of the vehicle, and a cover 23 that is made of a synthetic resin and covers the outside of the handle main body 22.

The handle main body 22 integrally includes a grip portion 22a, a support arm portion 22b, and a guide arm portion 22c. The grip portion 22a has a substantially U-shaped cross section opening toward the outside of the outer panel 12 and extends in the fore-and-aft direction of the vehicle. The support arm portion 22b is integrally provided at one end of the grip portion 22a and has a substantially L-shaped form. The guide arm portion 22c is integrally provided at the other end of the grip portion 22a. The cover 23 is formed so as to extend in the fore-and-aft direction of the vehicle and to have a substantially U-shaped cross section opening toward the handle main body 22 so that the grip portion 22a of the handle main body 22 is fitted into the cover 23.

Provided in the handle case 13 is a curved portion 13c that protrudes inwardly relative to the outer panel 12 in order to form a recess 26 for allowing a vehicle user's hand to be inserted between the grip portion 22a of the handle main body 22 and the handle case 13. Also provided in the handle case 13 forward of the curved portion 13c (to the right in FIG. 2 and FIG. 4) are an insertion hole 27 into which the support arm portion 22b of the handle main body 22 is inserted, and an integral handle support portion 13d that holds, from opposite sides, the support arm portion 22b, which is inserted inside the outer panel 12 through the insertion hole 27. The support arm portion 22b is pivotably supported by the handle support portion 13d via a support pin 28. Therefore, said one end of the operating handle 14 is pivotably supported in the handle case 13.

A guide tube portion 13e extending inwardly of the outer panel 12 is integrally provided in the handle case 13 to the rear of the curved portion 13c (to the left in FIG. 2 and FIG. 5). The guide arm portion 22c on said other end side of the handle main body 22 is movably inserted into the guide tube portion 13e. A bellcrank 29 is pivotably supported on the guide tube portion 13e so that it can pivot around an axis orthogonal to the pivot axis of the operating handle 14, that is, the axis of the support pin 28. One end of the bellcrank 29 engages with an engagement hole 30 provided in the guide tube portion 13e. That is, the operating handle 14 is coupled to the bellcrank 29.

A torsion spring 31 is provided between the bellcrank 29 and the guide tube portion 13a. The bellcrank 29 is biased by the spring force of the torsion spring 31 in a direction in which the guide arm portion 22c engaged with the bellcrank 29, is pushed inwardly of the outer panel 12.

The base member 15, which is made of a synthetic resin, is mounted on the handle case 13 via a screw member 32 so as to cover a portion, to the rear of the guide tube portion 13e, of the handle case 13. The base member 15 is formed at said other end of the operating handle 14 so that, when the operating handle 14 is in a non-operated state, a smoothly connecting shape is made with a slight gap to have an integral appearance.

A cylindrical nut 33 is mold-bonded to a portion of the handle case 13 covered by the base member 15. A metal support plate 35 is mounted on the handle case 13 by screwing and tightening into the nut 33 a bolt 36 inserted through the support plate 35 with a cap-shaped seat member 34 attached to the nut 33 disposed between the support plate 35 and the nut 33. The support plate 35 supports a cylinder lock 37, and the cylinder lock 37 is mounted on the handle case 13 so that one end thereof faces a key insertion hole 38 provided in the base member 15.

The other end of the bellcrank 29 is coupled to a latch mechanism (not illustrated); when the cylinder lock 37 is in an unlocked state, if the operating handle 14 is not being operated, the bellcrank 29 is in the non-operated position shown in FIGS. 2 and 5, and at this time the latch mechanism maintains the vehicle door 11 in a closed state. When the bellcrank 29 pivots from the position of FIG. 5 to an actuated position as a result of actuation of the guide arm portion 22c due to operation of the operating handle 14, the latch mechanism releases the closed state of the vehicle door 11, thereby enabling the vehicle door 11 to be opened by operation of the operating handle 14.

A rectangular housing recess 41 is formed in the handle main body 22 of the operating handle 14 so as to open on the cover 23 side, and a sensor unit 42 is fixedly housed in the housing recess 41.

Figure 6:
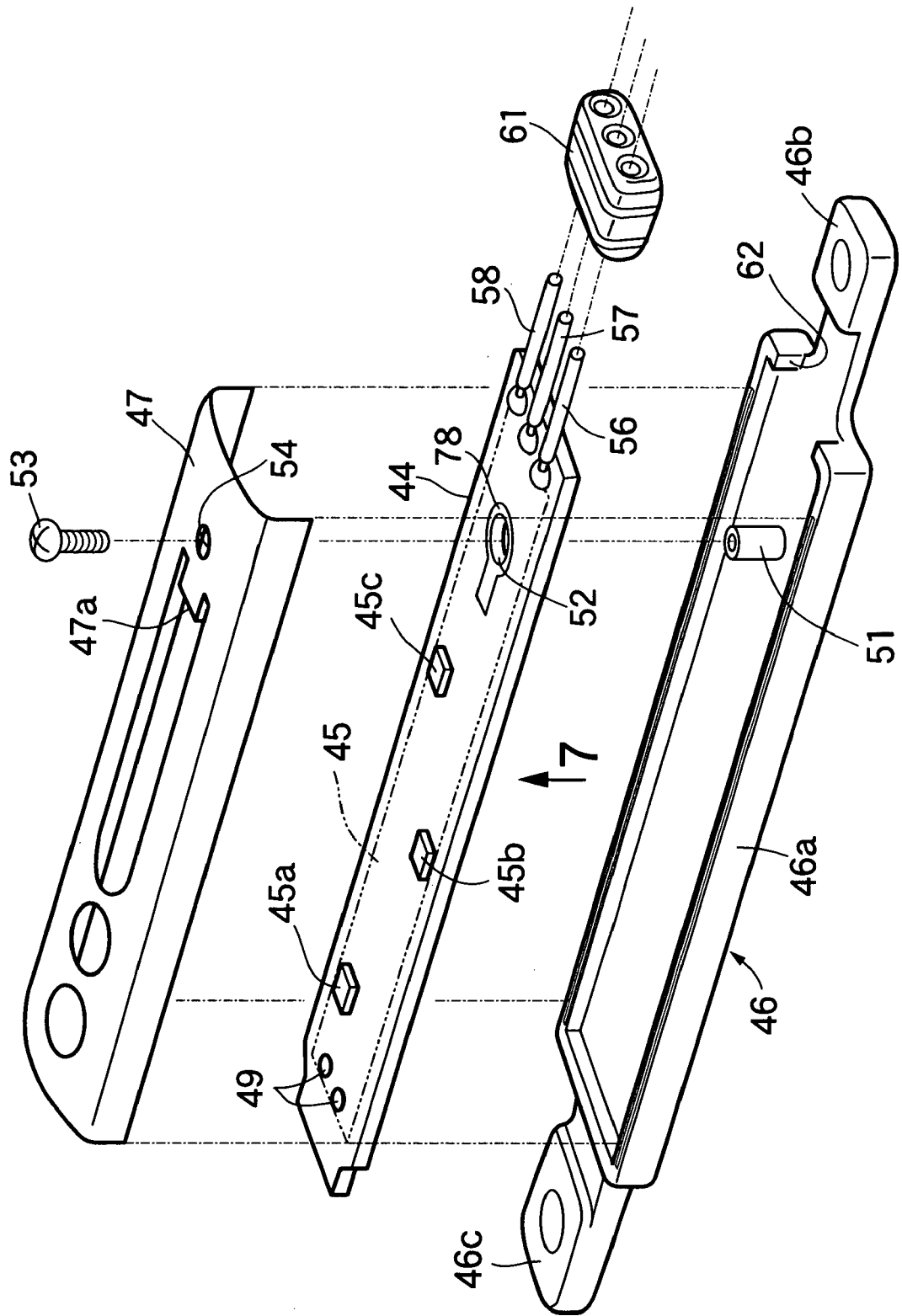
FIG. 6 is an exploded perspective view of a holder, a circuit board, and a ground plate.
Figure 7:
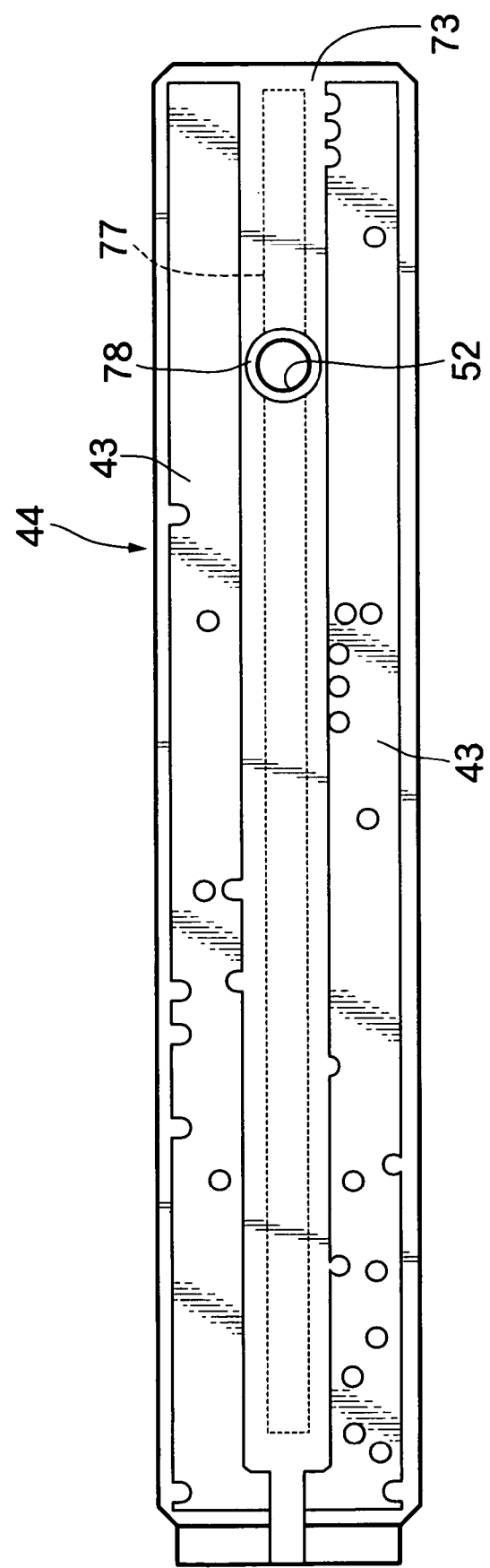
FIG. 7 is a view from arrow 7 in FIG. 6.

Referring to FIG. 6 and FIG. 7 together, the sensor unit 42 is formed by covering, with a synthetic resin covering portion 48, a pair of electrodes 43, a circuit board 44 provided with a detection circuit 45 for detecting a change in capacitance between the electrodes 43, a majority of a holder 46 on which the circuit board 44 is mounted, and a ground plate 47 attached to the holder 46 so as to cover the electrodes 43 and the circuit board 44 from the cover 23 side.

Figure 8:
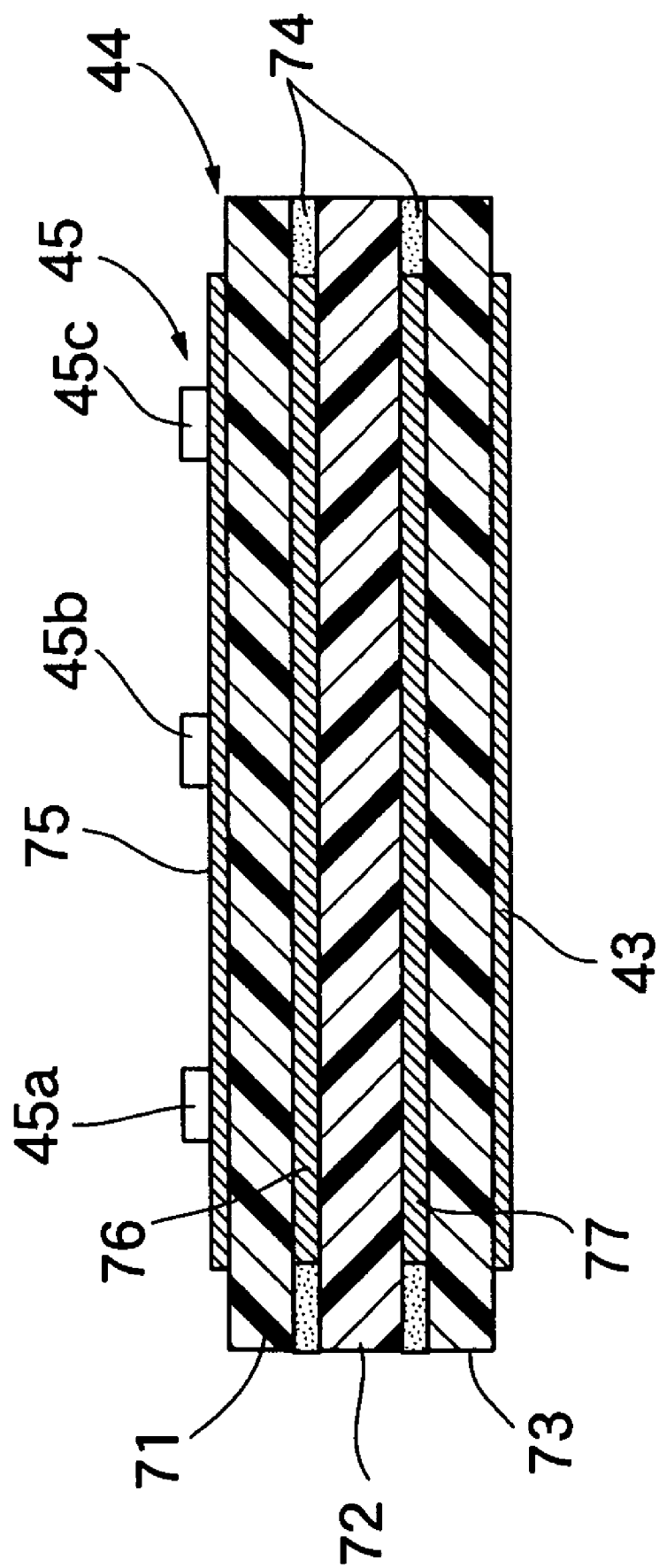
FIG. 8 is a transverse sectional view of the circuit board in which the thickness of members forming the circuit board is exaggeratedly enlarged.

FIG. 8 is a transverse sectional view in which the thickness of members forming the circuit board 44 is exaggeratedly enlarged for ease of understanding the arrangement of the circuit board 44. In FIG. 8, the circuit board 44 is formed by joining with an adhesive 74 three substrates 71, 72, and 73 made of a glass-filled epoxy resin; a component surface pattern 75 is formed from copper foil on one face of the substrate 71, a power source pattern 76 is formed from copper foil between the other face of the substrate 71 and one face of the substrate 72, a ground pattern 77 is formed from copper foil between the other face of the substrate 72 and one face of the substrate 73, and the pair of electrodes 43 are patterned from copper foil on the other face of the substrate 73.

The circuit board 44 has an overall thickness of, for example, 1.6 mm, and the patterns 75 to 77 and the electrodes 43 are formed at a thickness of on the order of a few tens of μm.

In such a circuit board 44, the detection circuit 45 is provided on the circuit board 44 by mounting components 45a, 45b, 45c, etc. on one face of the circuit board 44 on the ground plate 47 side, that is, on the side opposite to the vehicle, on which the component surface pattern 75 is formed; and the electrodes 43 are patterned on the other face of the circuit board 44 on the side opposite to the side where the components 45a, 45b, 45c, etc. are mounted, that is, on the vehicle side.

Moreover, as shown in FIG. 7, the ground pattern 77, which is connected to the detection circuit 45, is disposed at a position offset from the electrodes 43 if viewed through the circuit board 44. The electrodes 43 are patterned on the circuit board 44 in parallel to each other, whereas the ground pattern 77 is disposed at a position corresponding to a position between the electrodes 43.

Moreover, the circuit board 44 is provided with a conductive tube portion 78 so as to be connected to the ground pattern 77, the conductive tube portion 78 forming a through hole 52 and having opposite ends thereof facing opposite faces of the circuit board 44.

Figure 9:
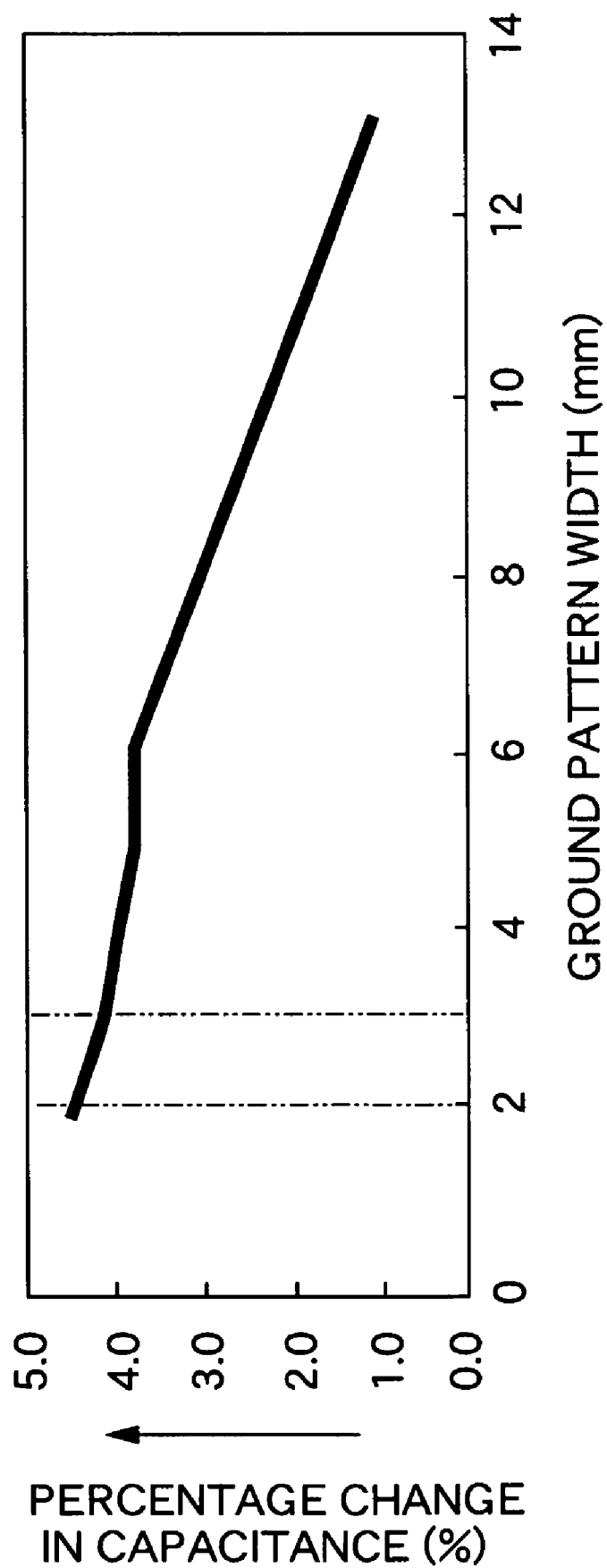
FIG. 9 is a diagram showing how capacitance change characteristics depend on the width of a ground pattern.

When the pair of electrodes 43 are patterned on the circuit board 44, the capacitance between the electrodes 43 and the ground pattern 77 increases; since this increase in capacitance is added to an original base capacitance (C component) of the circuit board 44 when a change in capacitance is detected by the pair of electrodes 43, the percentage change in capacitance upon the approach or touch of a vehicle user's hand becomes small, and if the sensitivity is increased as a countermeasure, noise is easily detected. Therefore, it is necessary to set the percentage change in capacitance at as large a value as possible; the percentage change (%) in capacitance with respect to changes in the width of the ground pattern 77 disposed at a position corresponding to a middle section between the electrodes 43 when the spacing between the electrodes 43 is 5 mm, changes as shown in FIG. 9. That is, the smaller the overlap with the electrodes 43 by reducing the width of the ground pattern 77, the larger the percentage change in capacitance.

Figure 10:
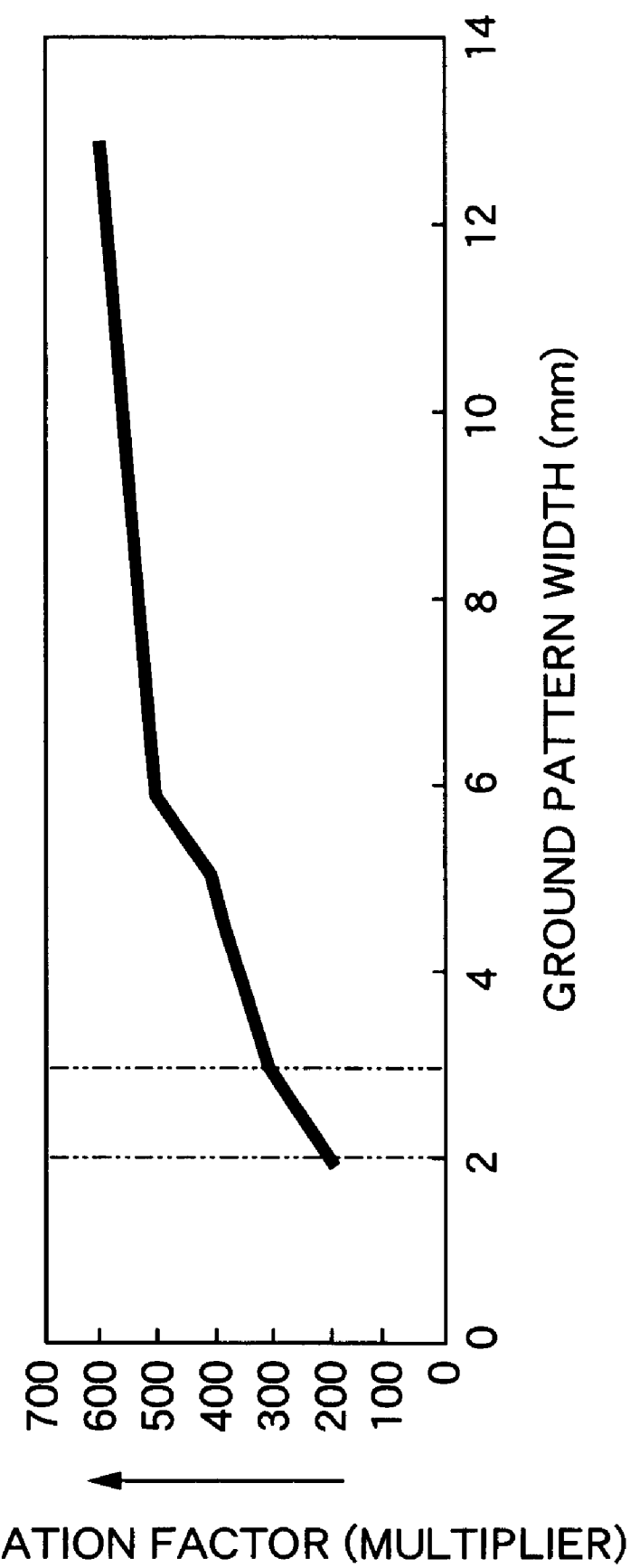
FIG. 10 is a diagram showing how amplification factor characteristics depend on the width of the ground pattern.

In accordance with the characteristics of the percentage change of the capacitance shown in FIG. 9 above, the detection circuit 45 is required to amplify a change in the capacitance detected by the electrodes 43 with an amplification factor (multiplier) in accordance with the amplification factor characteristics shown in FIG. 10. Since the percentage change in capacitance increases as the width of the ground pattern 77 becomes narrower, the required amplification factor becomes smaller when the overlap with the electrodes 43 is decreased by reducing the width of the ground pattern 77.

Figure 11:
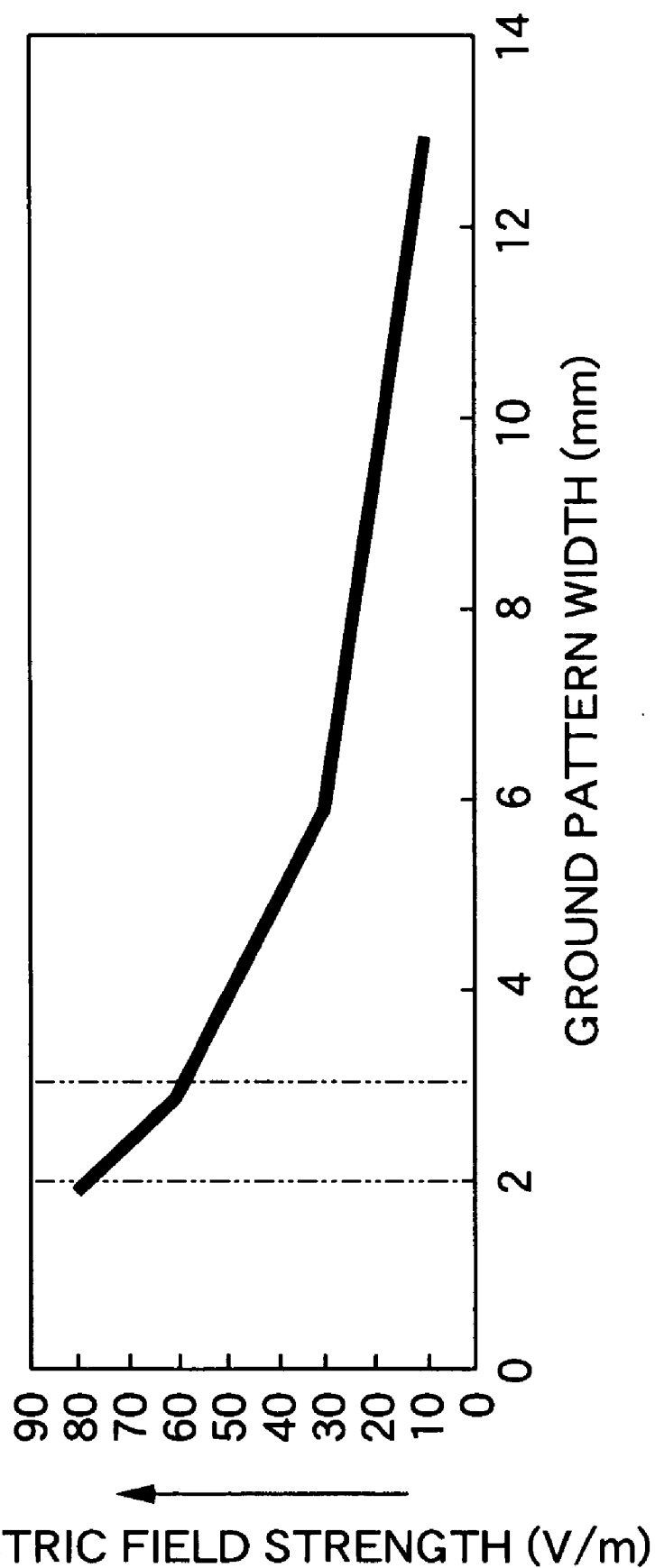
FIG. 11 is a diagram showing how noise immunity characteristics depend on the width of the ground pattern.

Furthermore, in accordance with FIG. 11, in which noise caused by something other than the approach or touch of the vehicle user's hand is expressed as an electric field strength (V/m) to illustrate a limit for malfunction due to noise, the lower the overlap with the electrodes 43 by reducing the width of the ground pattern 77, the higher the electric field strength at which malfunction occurs, and it is found that the lower the overlap with the electrodes 43 by reducing the width of the ground pattern 77, the higher the noise immunity.

In accordance with the above-mentioned capacitance change characteristics, amplification factor characteristics, and noise immunity characteristics shown in FIG. 9 to FIG. 11, it is clear that, by setting the overlap with the electrodes 43 at a small value by reducing the width of the ground pattern 77, the base capacitance of the circuit board 44 is decreased, the percentage change in capacitance upon the approach or touch of the vehicle user's hand is prevented from decreasing, and the noise immunity can be improved. It is preferable for the width of the ground pattern 77 to be set at 2 to 3 mm when the spacing between the electrodes 43 is 5 mm.

The holder 46 is formed from a rigid synthetic resin so as to integrally have a holder main portion 46a, a first arm portion 46b, and a second arm portion 46c. The holder main portion 46a is formed into a rectangular box shape opening on the cover 23 side and covered by the covering portion 48. The first arm portion 46b protrudes forward from a front end part of the holder main portion 46a and projects from the covering portion 48. The second arm portion 46c protrudes rearward from the rear end of the holder main portion 46a and projects from the covering portion 48.

The circuit board 44 is disposed so as to cover an open end of the holder main portion 46a, and the face of the circuit board 44 on which the electrodes 43 are disposed is bonded and fixed to a base of the holder main portion 46a by means of double-sided tape (not illustrated). Furthermore, a pair of connection holes 49 for electrically connecting the electrodes 43 to the detection circuit 45 are provided in a rear part of the circuit board 44.

The ground plate 47 is formed in a substantially U-shaped cross section so as to cover the holder main portion 46a of the holder 46 and the circuit board 44 from the cover 23 side. A mounting boss 51 that passes through the through hole 52 of the circuit board 44 is projectingly provided integrally with the holder main portion 46a of the holder 46 so as to be in contact with the ground plate 47. Furthermore, a connecting plate portion 47a projecting on the circuit board 44 side in the vicinity of the mounting boss 51 is formed in the ground plate 47 by punching upwardly a part of the ground plate 47. A through hole 54 is provided in the ground plate 47 in a portion corresponding to the mounting boss 51. The circuit board 44 and the ground plate 47 are mounted on the holder 46 by screwing and tightening a screw member 53 passed through the through hole 54 of the ground plate 47 into the mounting boss 51. Moreover, the ground plate 47 is electrically connected to the ground pattern 77 of the circuit board 44 by soldering the connecting plate portion 47a to one end of the conductive tube portion 78 which extends to the ground pattern 77 of the circuit board 44, on one face of the circuit board 44.

Three conductors 56, 57, and 58 are connected by soldering to the detection circuit 45 of the circuit board 44; these conductors 56 to 58 are taken outside the holder main portion 46a via a lead opening 62 provided in a front part of the holder main portion 46a, and are passed through and retained by a grommet 61 attached to the first arm portion 46b of the holder 46. A harness 59 that collects together the conductors 56 to 58 is led outside via a lead out hole 60 provided in the support arm portion 22b of the handle main body 22.

The first and second arm portions 46b and 46c of the holder 46 project from the covering portion 48; a first mounting seat 63 is provided on the handle main body 22 forward of the housing recess 41, the extremity of the first arm portion 46b abutting against the first mounting seat 63, and a second mounting seat 64 is provided on the handle main body 22 to the rear of the housing recess 41, the extremity of the second arm portion 46c abutting against the second mounting seat 64. The first arm portion 46b is mounted on the first mounting seat 63 by a screw member 65, and the second arm portion 46c is mounted on the second mounting seat 64 by a screw member 66.

Figure 12:
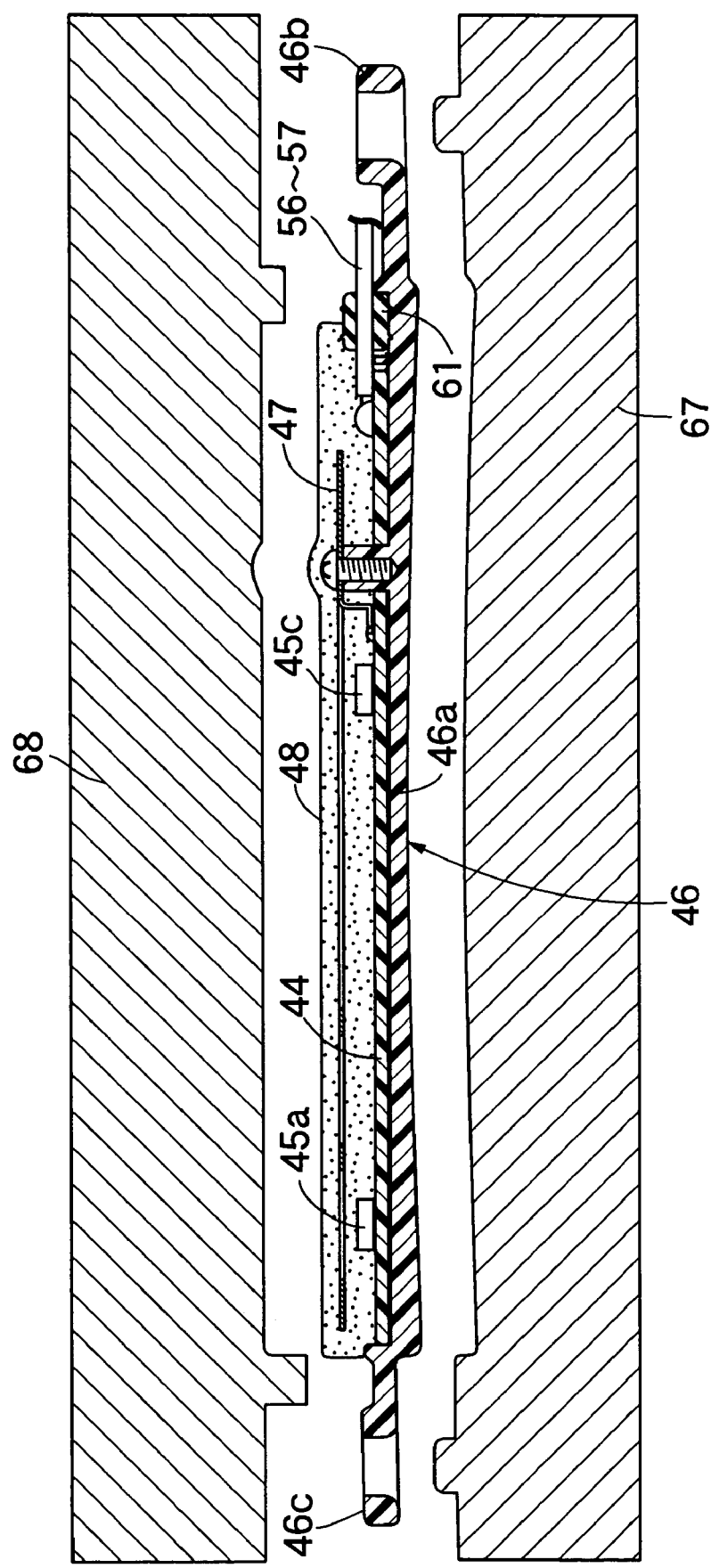
FIG. 12 is a vertical sectional view of a die for molding a covering portion of a sensor unit, with the die opened.

Referring to FIG. 12 together, the ground plate 47 and the circuit board 44 that has the pair of electrodes 43 patterned thereon and the detection circuit 45 provided thereon are assembled to the holder 46 in which the conductors 56 to 58 connected to the circuit board 44 are inserted through and retained by the grommet 61 attached to the first arm portion 46b; and the holder 46 is placed between dies 67 and 68 to be die-molded to provide the covering portion 48 thereby constituting the sensor unit 42. Since the first and second arm portions 46b and 46c of the holder 46 project from the covering portion 48, when the covering portion 48 is die-molded by means of the dies 67 and 68, the two arm portions 46b and 46c performs the functions of positioning and supporting the holder 46 within the dies 67 and 68.

By die-molding in this way, the covering portion 48 is formed in a shape that can be housed in the housing recess 41 of the handle main body 22. A waterproof seal 69 such as a sponge for preventing water from penetrating between the handle main body 22 and the sensor unit 42 and affecting the capacitance between the electrodes 43, is disposed between the covering portion 48 and the base wall of the housing recess 41 in a state in which the sensor unit 42 is housed in the housing recess 41, and this waterproof seal 69 is bonded to the covering portion 48 by means of, for example, double-sided tape.

The operation of this embodiment is now explained. Since the pair of electrodes 43, the circuit board 44 provided with the detection circuit 45 for detecting a change in capacitance between the electrodes 43, and the ground plate 47 covering the electrodes 43 from the cover 23 side are housed within the operating handle 14, a change in capacitance between the pair of electrodes 43 resulting from the vehicle user touching the operating handle 14 is detected by the detection circuit 45, thus reliably confirming a vehicle user's intention to unlock or lock.

Furthermore, since the sensor unit 42 including the pair of electrodes 43, the circuit board 44, and the covering portion 48 which is made of a synthetic resin and covers the electrodes 43 and the circuit board 45, is fixedly housed in the housing recess 41 formed in the handle main body 22 so as to open on the cover 23 side, the circuit board 44 and the pair of electrodes 43 can be easily assembled within the operating handle 14 and the water proofing of the circuit board 44 and the electrodes 43 can be improved.

Moreover, since the electrodes 43 are patterned on the circuit board 44, it is unnecessary to secure a space for arranging the electrodes 43 separately from the circuit board 44, thereby enabling the sensor unit 42 and, consequently, the operating handle 14, to be made thin. Furthermore, since the electrodes 43 are patterned on the face of the circuit board 44 on the vehicle side, it is possible to reliably detect the vehicle user's hand touching the face of the operating handle 14 on the vehicle side when the vehicle user grasps the operating handle 14.

Moreover, since the components 45a, 45b, 45c, etc. of the detection circuit 45 are mounted on the face of the circuit board 44 on the side opposite to the face where the electrodes 43 are patterned, it is possible to make the sensor unit 42 thin and make the operating handle 14 yet thinner.

Furthermore, the circuit board 44 is mounted on the holder 46, a majority of which is covered by the covering portion 48 so as to form a part of the sensor unit 42. Therefore, when the covering portion 48 is die-molded so as to cover the circuit board 44, it is possible to position and support the circuit board 44 with the holder 46, thus enabling the covering portion 48 to be easily die-molded.

Moreover, since the electrodes 43 are patterned on the circuit board 44 and the ground pattern 77 connected to the detection circuit 45 is formed at a position offset from the electrodes 43 if viewed through the circuit board 44, it is possible to suppress an increase in capacitance between the ground pattern 77 and the electrodes 43, to suppress a decrease in the percentage change in capacitance upon the approach or touch of the vehicle user's hand, and to enhance the noise immunity.

Moreover, since the electrodes 43 are patterned on the circuit board 44 in parallel to each other and the ground pattern 77 is disposed at a position corresponding to a position between the electrodes 43, it is possible to efficiently arrange the ground pattern 77 and the patterns of the electrodes 43 within the circuit board 44 while suppressing an increase in capacitance.

Furthermore, since the ground plate 47 forming a part of the sensor unit 42 is mounted on the holder 46 so as to cover the electrodes 43 and is covered by the covering portion 48, it is possible to easily incorporate the ground plate 47 in the sensor unit 42, thereby enhancing the ease of assembly of the ground plate 47 to the handle main body 22.

Moreover, since portions of the holder 46 projecting from the covering portion 48, that is, the first and second arm portions 46b and 46c, are mounted on the first and second mounting seats 63 and 64 provided on the handle main body, the holder 46 can be mounted at a predetermined position of the handle main body 22, and it is possible to easily set the positions of the electrodes 43 within the operating handle 14 by mounting the circuit board 44, on which the electrodes 43 are patterned, on the holder 46. Therefore, it is possible to maintain a constant spacing between the surface of the handle main body 22 and the electrodes 43, thereby stably detecting a change in capacitance.

Although an embodiment of the present invention has been described in detail above, the present invention can be modified in a variety of ways without departing from the subject matter of the present invention.

What is claimed is:

1. A vehicle door outer handle system comprising:
   an operating handle comprising a handle main body made of a synthetic resin and a cover made of a synthetic resin so as to cover the outer side of the handle main body, the operating handle being disposed on an outer side of a vehicle door;
   a pair of electrodes; and
   a circuit board on which a detection circuit is provided for detecting a change in capacitance between the electrodes;
   the electrodes and the circuit board being housed within the operating handle;
   wherein the electrodes and a ground patterned connected to the detection circuit are patterned on the circuit board, and the ground pattern is formed so as to be disposed at a position offset from the electrodes if viewed through the circuit board; and
   wherein the electrodes are patterned on the circuit board in parallel to each other, and the ground pattern is disposed at a position corresponding to a position between the electrodes, the ground pattern having a width narrower than a distance between the pair of electrodes.

2. The vehicle door outer handle system according to claim 1, wherein the electrodes are formed as printed patterns on a surface of the circuit board with a gap defined on the surface between the electrodes, and the ground pattern is formed on another surface of the circuit board in a location corresponding to said gap if viewed through the circuit board.

3. The vehicle door outer handle system according to claim 1, wherein the ground pattern is disposed only at the position corresponding to the position between the electrodes.

4. The vehicle door outer handle system according to claim 1, wherein the electrodes are formed on one surface of the circuit board and the detection circuit is formed on another surface of the circuit board.

5. The vehicle door outer handle system according to claim 1, wherein the circuit board is a laminate structure.

6. The vehicle door outer handle system according to claim 5, wherein the electrodes are formed on a surface of the circuit board, the ground pattern is formed on a second surface of the circuit board, and the detection circuit is formed on a third surface of the circuit board.

* * * * *